United States Patent
Takagi et al.

(10) Patent No.: US 7,062,346 B2
(45) Date of Patent: Jun. 13, 2006

(54) METHOD FOR MANUFACTURING MULTI-KIND AND SMALL QUANTITY SEMICONDUCTOR PRODUCTS IN A MASS-PRODUCTION LINE AND SYSTEM THEREOF

(75) Inventors: Osamu Takagi, Kawasaki (JP); Tsuneo Iizuka, Kawasaki (JP); Tetsurou Honda, Yokohama (JP); Takuya Honda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/858,075

(22) Filed: Jun. 2, 2004

(65) Prior Publication Data

US 2004/0225385 A1 Nov. 11, 2004

Related U.S. Application Data

(60) Division of application No. 09/956,151, filed on Sep. 20, 2001, now Pat. No. 6,862,725, which is a continuation of application No. PCT/JP00/01763, filed on Mar. 23, 2000.

(30) Foreign Application Priority Data

Mar. 24, 1999 (JP) .................................. 11-079704

(51) Int. Cl.
*G06F 19/00* (2006.01)
*G06F 17/60* (2006.01)

(52) U.S. Cl. .......................... 700/116; 716/19; 716/20; 716/21; 700/115; 700/121; 257/E21.525; 257/E23.179

(58) Field of Classification Search ................. 716/11, 716/2, 5, 19–21; 713/200; 700/116, 121, 700/115, 90; 438/10, 15–17; 365/201; 209/573; 257/E21.525, E23.179
See application file for complete search history.

(56) References Cited

U.S. PATENT DOCUMENTS

| | | | | |
|---|---|---|---|---|
| 4,419,747 A | * | 12/1983 | Jordan | 365/201 |
| 4,510,673 A | * | 4/1985 | Shils et al. | 438/15 |
| 5,360,747 A | * | 11/1994 | Larson et al. | 700/121 |
| 5,448,488 A | | 9/1995 | Oshima | 364/468 |

(Continued)

FOREIGN PATENT DOCUMENTS

JP  6-252020  9/1994

(Continued)

OTHER PUBLICATIONS

SEMI Wafer Map Data Draft Document; Doc #3101 SE; Dec. 1999.

*Primary Examiner*—Jayprakash N. Gandhi
*Assistant Examiner*—Steven R. Garland
(74) *Attorney, Agent, or Firm*—Westerman, Hattori, Daniels & Adrian, LLP

(57) ABSTRACT

A method for manufacturing multi-kind and small-quantity semiconductor products in a mass-production line and a system thereof are provided. In the method for manufacturing a semiconductor device through a plurality of fabrication processing steps, each of the chips on a wafer is controlled based on a chip identification information formed on a wafer. The method includes the step of editing the chip identification information such that the chip identification information for chips having the same fabrication processing steps and chips formed on the same wafer can be read out successively. The method also includes the step of carrying out each of the fabrication processing steps based on the chip identification information formed on the wafer by reading out the chip identification information.

7 Claims, 8 Drawing Sheets

U.S. PATENT DOCUMENTS

| | | | |
|---|---|---|---|
| 5,856,923 A * | 1/1999 | Jones et al. | 700/121 |
| 5,892,900 A | 4/1999 | Ginter et al. | 395/186 |
| 5,927,512 A * | 7/1999 | Beffa | 438/17 |
| 5,950,012 A | 9/1999 | Shiell et al. | 395/712 |
| 6,161,213 A | 12/2000 | Lofstrom | 716/4 |
| 6,378,123 B1 | 4/2002 | Dupenloup | 716/18 |

FOREIGN PATENT DOCUMENTS

| | | |
|---|---|---|
| JP | 7-66091 | 3/1995 |
| JP | 8-138985 | 5/1996 |
| JP | 8-162380 | 6/1996 |
| JP | 9-36008 | 2/1997 |
| JP | 11-26333 | 1/1999 |

* cited by examiner

A1, A2, A3...: lot numbers
B1, B2...: wafer numbers
C1, C2...: chip numbers
D1, D2...: chip coordinates on a wafer
E1, E2...: code coordinates on a chip
F1, F2...: testing results

METHOD FOR MANUFACTURING MULTI-KIND AND SMALL QUANTITY SEMICONDUCTOR PRODUCTS IN A MASS-PRODUCTION LINE AND SYSTEM THEREOF

This application is a divisional application of prior application Ser. No. 09/956,151, now U.S. Pat. No. 6,862,725, filed Sep. 20, 2001, which is a continuation of prior International Application No. PCT/JP00/01763, filed on Mar. 23, 2000.

BACKGROUND OF THE INVENTION

1. Field of the Invention

The present invention relates to a method for processing semiconductor products, and more particularly, to a method for manufacturing multi-kind and small-quantity semiconductor products in a mass-production line and a system thereof.

2. Description of the Related Art

Large quantities of semiconductor wafers in a lot are usually fabricated under the same processing conditions in a semiconductor manufacturing system. Such a mass-production method has greatly improved productivity of semiconductor products having the same specification in a large volume. However, if the mass-production method is applied to multi-kind and small-quantity semiconductor products, productivity of semiconductor products is lowered because processing conditions need to be frequently changed for the respective specifications of small-lot semiconductor products. Particularly, a recent increasing tendency in wafer diameter results in further decrease of a number of wafers in a lot fabricated under the same processing condition because a wafer of larger diameter has larger numbers of chips in a wafer, which further lowers productivity of semiconductor products. Therefore, it has been required to the semiconductor manufacturing system that the processing conditions can be changed quickly and flexibly for multi-kind and small-quantity semiconductor products, and that quality control can be carried out with respect to individual chips of various specifications without confusion.

Referring to FIG. 1, a conventional semiconductor manufacturing system used for manufacturing a semiconductor device is schematically illustrated. Main fabrication processing steps from 310 to 319 in the processing sequence are shown in the first row 301 while the corresponding apparatus, data and data transfer paths are also shown in the second, third and forth rows 302, 303, 304, respectively. When we look at the first column, layout patterns of circuits are designed in the first step 310, in which functions and characteristics of the final completed integrated circuit are determined, and then logic and circuit designs are carried out by using CAD, by which patterns and positions of circuit elements or interconnection layers therebetween are determined on a chip. The chip patterns include aligning marks and scribe lines therein needed for the wafer fabrication processing step.

Referring to FIG. 4, an example of the layout pattern of mask fabricated by the above conventional method is shown in relation to a wafer, in which a chip pattern 1, a mask-pattern 2 having repetitive pattern of the chip pattern and a wafer pattern 3 are also shown relatively. In the wafer fabrication processing step described later, transferring of the mask pattern 2 onto the wafer 3 needs to be carried out such that the largest number of chips can be obtained by the least number of shots in exposure. As shown in FIG. 4, a chip having a full area in both the mask-pattern and the wafer pattern is an effective chip for fabrication (shaded in the figure), while the non-shaded chips are ineffective chips located in each of four corners of the mask. Therefore, in designing of the layout pattern, the aligning of the mask pattern 2 to the wafer pattern 3 is optimized such that the largest number of the effective chips in a wafer is obtained. After the designing of the layout pattern is completed, the layout pattern is stored in a magnetic storage media such as magnetic cards, and then sent to the next mask processing step 311 by way of a data transferring path a' as shown in FIG. 1. In a usual practical operation of the semiconductor manufacturing system, the foregoing magnetic storage media is manually set on an apparatus to be used for the next fabrication processing step by an operator. The rest of the data transferring paths from b' to f' shown in FIG. 1 are performed by the method similar to that of the data transferring path a'. In the mask fabrication processing step 311, the chip data in the layout data is transformed into photolithographic data readable by an electron beam exposure system. Then, a set of glass masks to be used for a plurality of the corresponding wafer processing steps are fabricated based on the transformed photolithographic data. In the wafer processing step 312, a plurality of the wafer processing steps are carried out by using the foregoing set of glass masks. Namely, after a conductive or insulating film is grown on the surface of a wafer by using a CVD system or a sputtering system, a photoresist film is coated thereon by spinner, and then the photoresist film is exposed by using a stepper with one from the set of glass masks. In the exposure step, an operator usually prints out the respective layout pattern shown in FIG. 4 on a paper or displays the same on a CRT to determine the relative position of the wafer to the glass mask. Next, etching patterns are formed by using an etching system with the delineated photoresist patterns on the wafer. A series of these wafer processing steps is repeated as many times as the number of the glass masks. The above described photolithographic processing step is generally applied to the pattern formation by full wafer aligning method. If higher accuracy of pattern formation is required, each of divided small regions on a wafer consisting of a chip or several chips is exposed repetitively step by step using a reticle, or alternately, a direct writing method by an electron beam exposure system. Next, in the wafer testing processing step 313 to which the wafers are transferred from the wafer fabrication processing step 312 ahead, after setting the initial conditions such as a starting position, moving direction and moving distance, chip characteristics of the wafers are measured. The measured result is recorded on a wafer map, in which the chip characteristics are recorded in relation with the corresponding chip address. The chip address is determined by choosing a base pattern formed in advance on the wafer as a mark for the standard position. Furthermore, in the wafer testing step 313, after defect chips are marked with a fault mark on the wafer based on the wafer map formed ahead, the wafer is transferred to the wafer breaking processing step. In the wafer breaking processing step 314, after the base pattern on the wafer is detected by detector, the wafer map accompanied with the wafer is read. Then, by aligning the wafer to the wafer map using the base pattern already detected, the initial conditions such as a starting position, moving direction and moving distance can be set for a dicing machine. Chips are separated from the wafer and then only good chips are selectively separated from the defect chips with the fault mark, and then, transferred to the next assembly step. Similarly, in the assembly step 315, after a starting position, moving direction and moving distance are set based on the wafer map for the wire bonding apparatus, each of the good chips fed from the wafer breaking processing step is mounted on a package. After the visual inspection is carried out with the packages, the packages excluding defect packages therefrom are transferred to the IC testing step. In the IC testing step 316, again on the base of the wafer map transferred hereto together with the IC packages, after setting the initial conditions for the tester, the semiconductor IC in a package is tested to screening good IC's from defect ones. Additionally, the screened semiconductor IC may be, upon request, divided into groups with respect the testing result and then transferred to the shipping step 319.

As explained above, the semiconductor manufacturing system is operated such that a plurality of fabrication processing steps are carried out sequentially but separately from one another to complete a semiconductor integrated circuit device. That is to say, the wafer transferred from the neighboring step ahead is processed in the present step, and then transferred to the next step successively. In each of the steps, a common test such as a visual inspection is performed on every chips of the processed wafer to screen defective chips, and then the testing result is recorded in the wafer map and sent to the next step in which the next processing step is executed referring the wafer map. On the wafer map, the testing result on each of chips on the wafer is recorded together with the respective address, which is indicated by chip coordinates. Additionally, lot numbers identifying manufacturing date and specifications, wafer numbers identifying wafers in a lot and chip numbers identifying chips on a wafer are also recorded on the same wafer map. The lot numbers, wafer numbers, chip numbers and coordinates are used as chip identification information formed on a wafer. The chip identification information is coded into an identification code formed on the wafer by the common fabrication processing steps with those of layout patterns. The chip identification code enables an operator to identify an individual chip on a wafer as well as to confirm the chip characteristics by referring the corresponding chip identification information recorded on the wafer map. Since, in the wafer breaking step or assembly step, a large number of chips are separated from one wafer to be processed individually, it is needed that the identification code can avoid from confusing the separated chips, and manages quality control of individual completed products. Since, in the layout pattern designing step 310, more or less, manufacturing system and date, or wafer dimension and batch size are still undetermined, it is difficult to determine the chip identification information at this stage. Consequently, lithography data for a mask or reticle, or an electron beam lithography system to form a chip identification code on a wafer is generated separately from data for circuit layout patterns, and then sent to the manufacturing system together with the data for circuit layout patterns at the beginning of the wafer fabrication processing steps. As an alternative method for identifying individual chips on a wafer to the foregoing method, it is proposed that individual chips have their memory circuits thereon to write and read the chip identification information. However, a drawback is that the memory circuits for this specific purpose occupies an extra silicon real estate.

In the semiconductor manufacturing system, in addition to the foregoing processing steps, data superposing analysis is performed to investigate the reasons for decreasing yield of products, in which, as shown in FIG. 1, data is sent to the data superposing analysis member 317 from respective processing steps. Since data generated by each of the processing systems is generally different in data format from each other, the data must be transformed into the common data format by data transformation system 318 before the data sent to the data superposing analysis member 317. In general, chip size or dimension and location of I/O terminals in a chip are different from each other between IC products, and that some steppers, probers or fabrication processing systems are also different in operating method or protocol from each other. Resultantly, when the semiconductor manufacturing system is operated, the initial setting conditions must be given to each of the various fabrication processing steps or testing systems for every respective products having different specifications. Particularly to a diversified and small quantity production, it is nuisance to change various setting conditions as frequently as the numbers of the respective batches of a small quantity wafers.

In the conventional semiconductor manufacturing system, whenever wafers and the wafer maps are transferred from the step ahead, identifying whether or not the setting conditions must be changed, and then the necessary changes are made. For instance, in wafer fabrication processing steps, after reading the lot number on a wafer, the initial setting conditions must be given to each of the various fabrication processing systems, and in wafer testing step, after reading chip coordinates and lot number on a wafer, chip dimension, numbers of pads for I/O terminals on the chip and difference in their allocations must be confirmed and then the setting conditions must be given in the initial allocations, amount and direction of motion. Since a normal wafer processing operation begins after all the preparing operations as described above are completed, it takes much time to begin the normal processing operation on the wafer coming in from the preceding step for every respective products having different specifications.

Consequently, when the conventional semiconductor manufacturing system is applied to a diversified and small quantity production, there are drawbacks such that not only a percentage of time required for the preparing operations for every respective products before the normal processing operation on the wafer begins increases but also errors in the operation easily increase, which result in lowering of productivity. Additionally, there is the following problem in forming the identification code on a wafer. The layout pattern is usually composed of repetition of a single pattern on a wafer. In contrast, the identification code differs in its pattern from chip to chip on a single wafer. Therefore, if the conventional lithographic method is applied to a small area for the identification code pattern using reticles, a large number of the reticles specifically prepared are needed for each of step-and-repeat exposures, which incurs more complexity in processing steps and higher cost. On the other hand, all of the identification codes can be formed on the respective chips on a wafer by full-wafer exposure photolithography with a single mask, which may be simpler and less expensive. However, since the full-wafer exposure photolithography has been already incompatible with recent fine patterning techniques such as the step-and-repeat exposure method using reticles or the electron beam direct writing method, adopting the full-wafer exposure photolithography is impractical for a single purpose to form patterns of the identification codes. In particular, the method that a specific memory circuit is formed on the same chip results in increase of an extra chip area for the specific memory circuit and steps for reading and writing data, both of which make cost higher. The electron beam direct writing method for forming identification code on each of chips on a wafer has an advantage in compatibility with layout pattern formation as well as the step-and-repeat exposure method using reticles. However, it is necessary for the layout pattern formation by electron beam direct writing method that, to maintain pattern accuracy by limiting a deflection angle of the electron beam below a certain value, similarly to the step-and-repeat exposure method using reticles, an individual writing operation on every small areas on a wafer is repeated step by step. In other words, writing data fed to the electron beam direct writing system is edited in a unit for each of the small areas, by which after setting an initial position of an electron beam irradiation, each of the small areas is continuously irradiated by the electron beam to write layout patterns. A series of the writing operations are repeated for all of the small areas by setting an initial position of an electron beam irradiation. Applying this method to pattern formation of the identification codes to make compatibility with the layout pattern formation, in spite of the fact that pattern formation of the identification codes does not require such high accuracy as formation of the layout pattern, the same high accuracy is applied to the pattern formation of the identification code, which results in unnecessarily long time for the electron beam writing operation. Furthermore, since pattern formation of the identification codes is carried out in the early stage of the electron beam writing operation on a wafer, information on a testing result occurred in the later processing step, for instance, information obtained in the chip testing step, can not be contained in the identification codes, and that the information can not be obtained unless the wafer map is referred. Consequently, it incurs much time and labor, and even inadvertent mistakes to know the testing result of a specific chip, particularly after separating chips from a wafer.

SUMMARY OF THE INVENTION

Accordingly, it is an important object of the present invention to provide a method and system for manufacturing semiconductor integrated circuits of a multi-kind and small-quantity production with high efficiency as well as for facilitating chip-to-chip control of quality and production with low cost.

In accordance to the above object, one aspect of the present invention, there is provided the method for manufacturing a semiconductor device through a plurality of fabrication processing steps, each of the fabrication processing steps being carried out sequentially with a plurality of chips on a wafer by the corresponding fabrication processing apparatus, the method comprising at least two steps sharing a chip identification information formed on the wafer by distributing the chip identification information to the corresponding fabrication processing apparatus, wherein the steps are not immediately neighbored with each other in fabrication processing sequence.

another aspect of the present invention, there is provided the method for manufacturing a semiconductor device through a plurality of fabrication processing steps, each of the plurality of fabrication processing steps being carried out sequentially based on a chip identification information formed on a wafer, the method comprising a step of sending additional processing information resulted from performance of one of the plurality of fabrication processing steps to at least another of the plurality of fabrication processing, wherein the fabrication processing steps sharing the additional processing information with each other are not immediately neighbored with each other in fabrication processing sequence.

As a result, since the above described methods allow each of the fabrication processing steps to share the chip identification information to each other before the corresponding fabrication processing step is carried out, chip-to-chip control of quality and production is facilitated, and each of the fabrication processing steps can start carrying out immediately after a wafer is transferred to the corresponding fabrication processing step.

Further, since the chip identification information is edited so as to be read out successively, it is possible for a beam writing apparatus to write the chip identification code on all chips of a wafer without interruption once a starting position of beam writing is set for the wafer, whereby there is no need to reset the starting position of beam writing for each of all the small areas on the wafer, which results in shorter time to write the chip identification code than in prior art.

Still further, it can take much shorter time to write the chip identification code on a package shielding a chip therein using the above writing data by a laser beam writing apparatus as well as an electron beam writing apparatus, particularly whereby a chip shielded in a package can be identified by visual inspection of the package.

Further, even if wafers differs in chip size, device characteristics or positions of input/output terminals among every lots of small-quantity wafers, the chip identification information including lot number, wafer number, chip number and chip coordinates makes it possible to set the initial position, moving distance or moving direction on the beam writing apparatus precisely by depending on the corresponding various differences, and to form the chip identification code continuously on a wafer lot-by-lot or wafer-by-wafer.

Additionally, since an additional information to the identification information after a chip identification code is formed on the wafer, is added to the wafer, chips separated from the wafer or an IC package, it is possible to confirm the chip property in detail without referring to the corresponding wafer map more easily than in prior art.

BRIEF DESCRIPTION OF THE DRAWINGS

The present invention will be more apparent from the following description, when taken to conjunction with the accompanying drawings, in which.

DESCRIPTION OF THE PREFERRED EMBODIMENT

Embodiment 1

Figure 2:
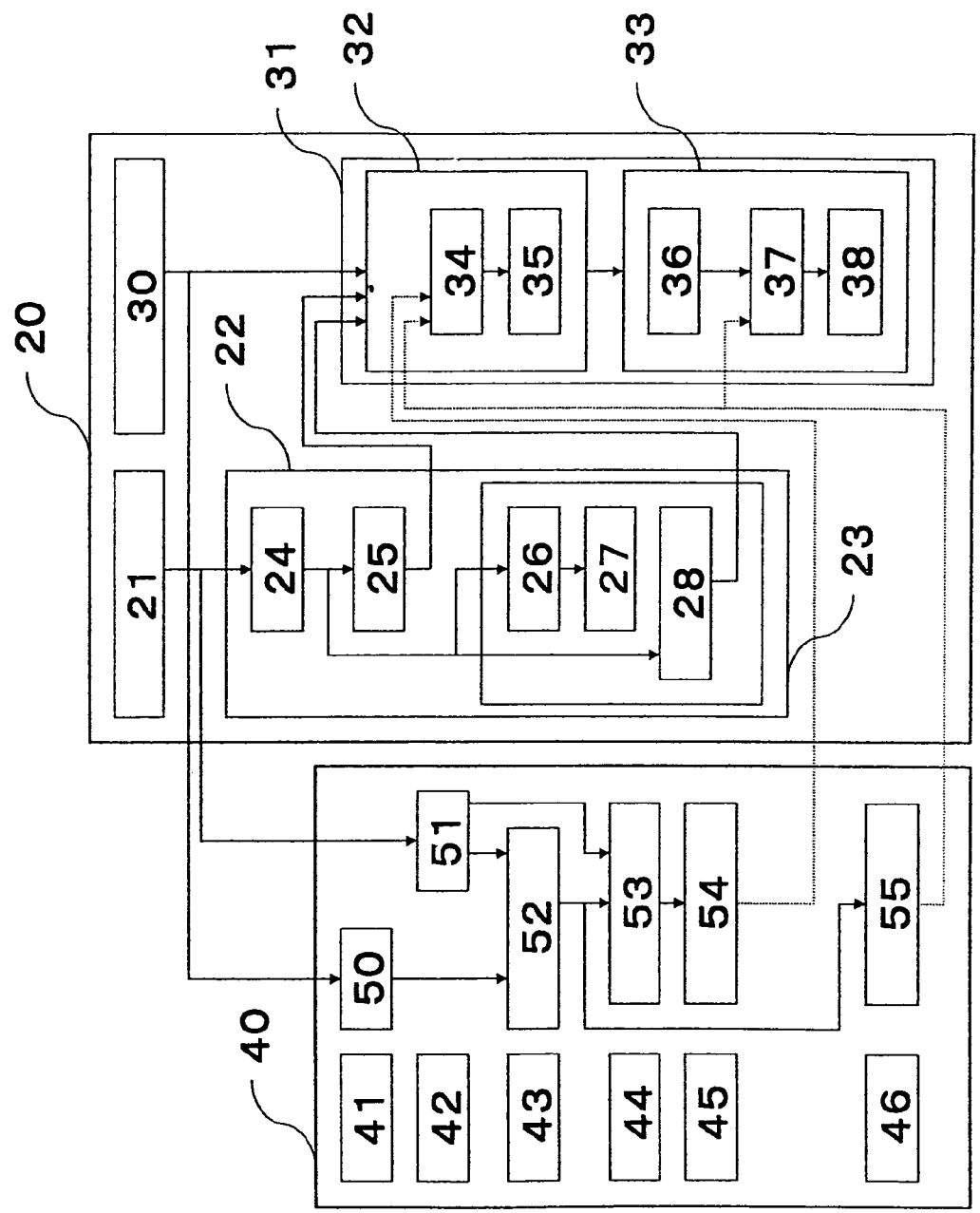
FIG. 2 is an illustration of information flows for a method for manufacturing a semiconductor device for the first embodiment according to the present invention.

FIG. 2 is an illustration of information flows for a method for manufacturing a semiconductor device for the first embodiment according to the present invention.

The whole information flow chart is divided into tow parts, namely a semiconductor manufacturing system 20 and a history data formation system 40 which are as operatively connected to each other just as an organic system. In the semiconductor manufacturing system 20, a mask fabrication processing step indicated by block 22 and wafer fabrication processing steps indicated by block 31 are carried out based on semiconductor design information 21 and lot production information 30, respectively. Specifically, a block 22 includes mainly chip layout pattern design 24, wafer layout pattern design 25, and mask fabrication 23. The mask fabrication 23 further includes mainly exposure data formation 26, mask reticle formation 27 and electron beam writing data formation 28, in which data for mask design is stored in an electronic file. On the other hand, block 31 is divided into front end 32 and back end 33, and the front end 32 includes mainly wafer fabrication processing step 34 and wafer testing 35 while the back end 33 includes mainly wafer breaking 36, assembly 37 and IC testing 38. Each of actual fabrication processing steps in block 31 is performed by utilizing the corresponding electronic design data from the respective electronic file stored in block 22. In contrast, the history data formation system 40 includes operational functions indicated by blocks 50 through 55 which processes various electronic data files for the history of the respective chip to form the chip identification code, in which blocks 50 through 55 process electronic data of lot information 41, chip information 42, history data 43, layout data 44, electron beam writing data 45 and marking data 46, respectively. Particularly, the electronic data of the history of the respective chip is processed to mark the chip identification code on the chips, wafers and lots in blocks 50 through 52, respectively. These electronic data are finally fed to the front end 32 by way of the layout data transformation process 53 and the electron beam writing data transformation process 54 to control the electron beam writing processing step by the chip identification code on the wafer, or by way of the marking data transformation processing step 55 to mark the chip identification code on not only chips, wafers and lots but also completed packages.

Embodiment 2

Figure 3:
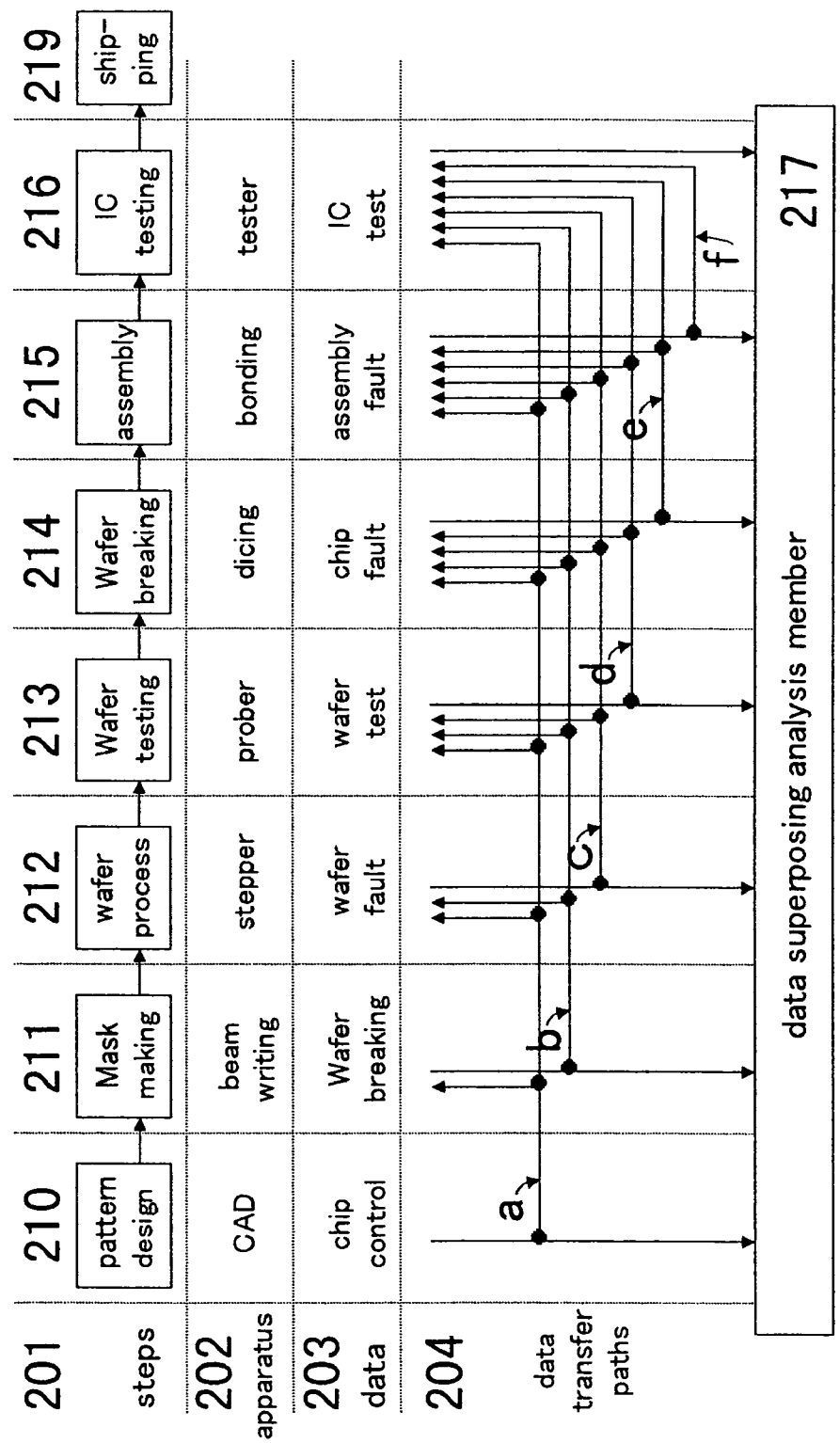
FIG. 3 is an illustration of a semiconductor manufacturing system for the second embodiment according to the present invention.

FIG. 3 is an illustration of a semiconductor manufacturing system for the second embodiment according to the present invention.

Figure 1:
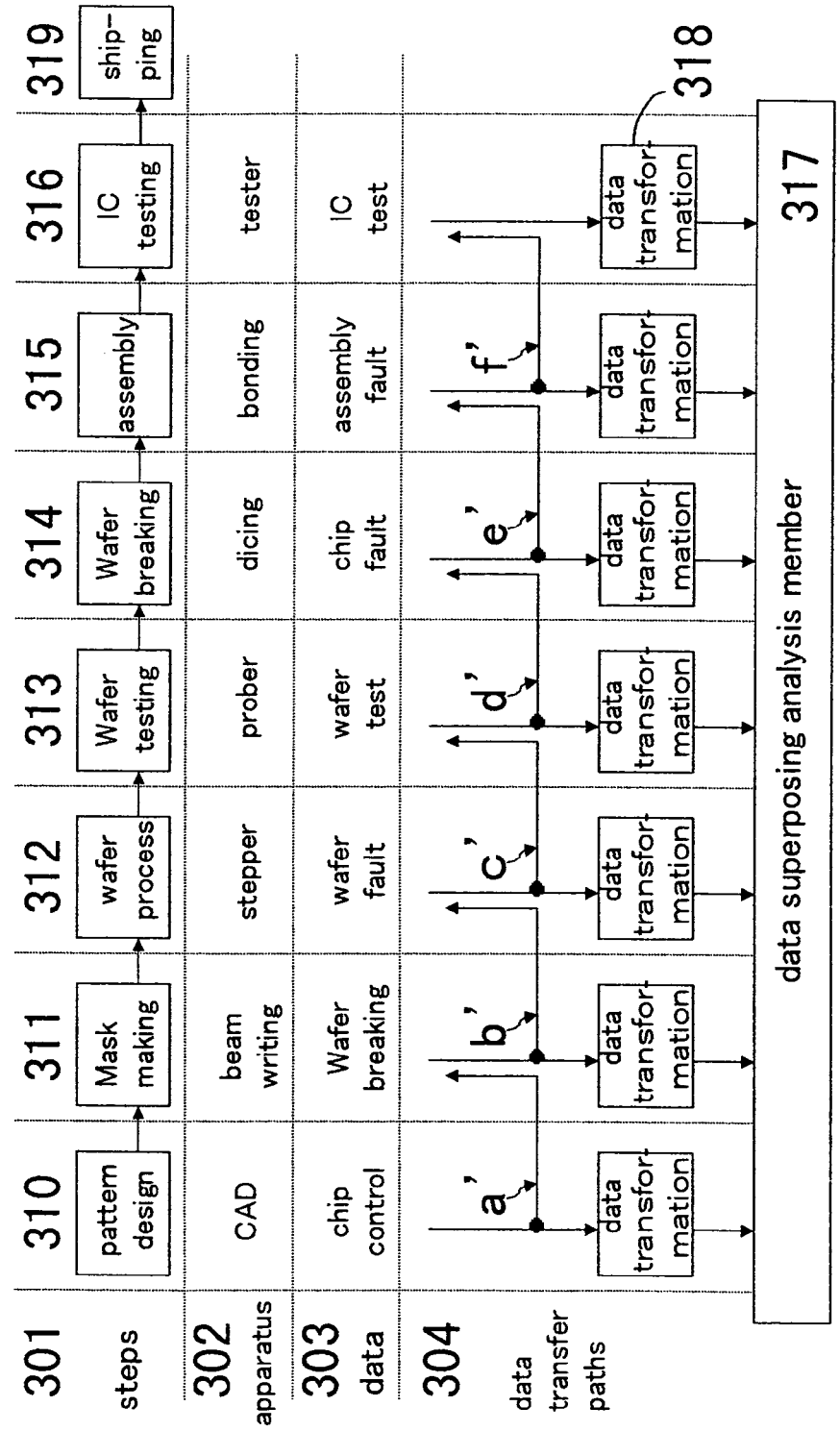
FIG. 1 is an illustration of a semiconductor manufacturing system of prior art.

As being similar to FIG. 1, main fabrication processing steps from 210 to 219 in the processing sequence are shown in the first row 201 in FIG. 3 while the corresponding apparatus, data and data transfer paths are also schematically shown in the second, third and forth rows 202, 203, 204, respectively. On-line computer terminals (not shown) are equipped to control the respective steps. Each of these on-line computer terminals are connected with the control member of the respective fabrication processing apparatus, by which data obtained in a fabrication processing step in interest are sent to the other fabrication processing steps in the form of an electronic file with appropriate timing. Conversely, the fabrication processing step in interest can receive data from the other processing steps to carry on to the fabrication processing apparatus therein. The data exchange between the different fabrication processing steps described below are carried out through the respective computer terminals.

Figure 4:
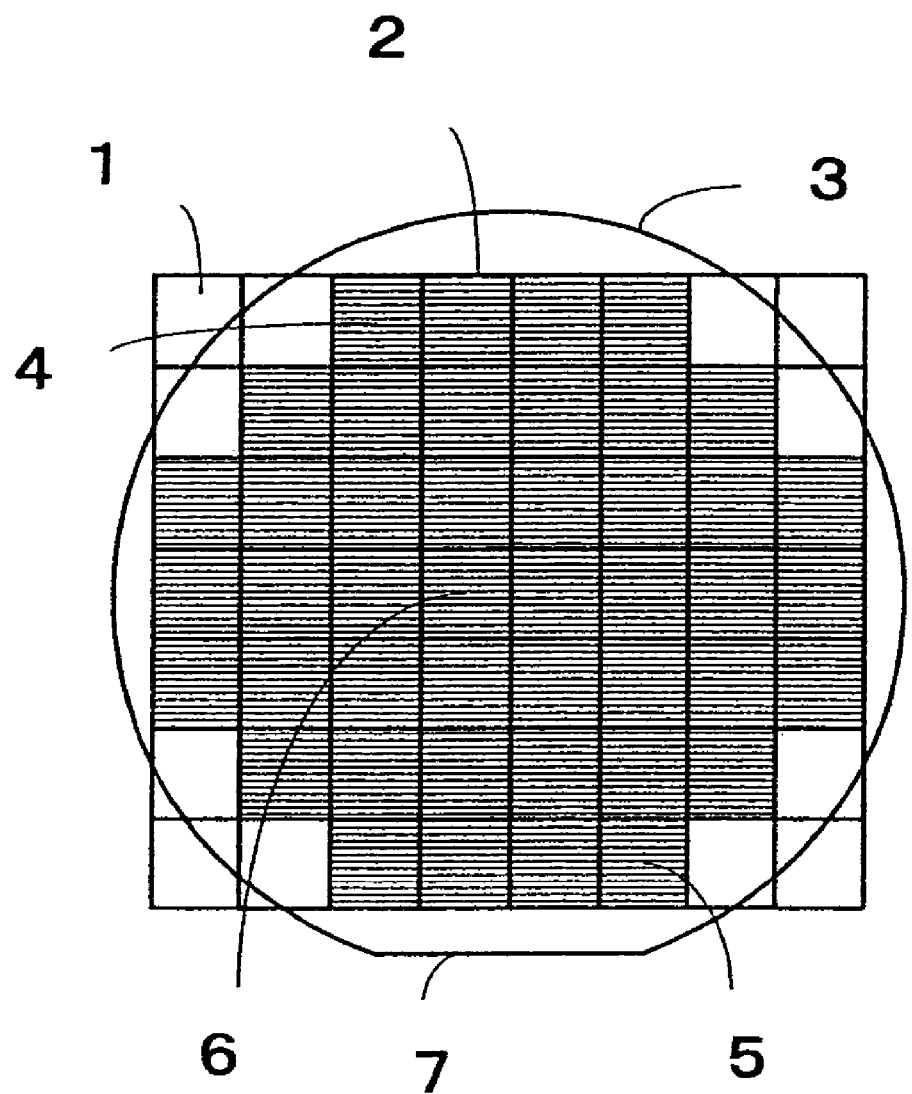
FIG. 4 is typical layout patterns of a wafer and a mask in prior art.

First, similar to the conventional technology, the layout pattern design 210 implements generation of a chip pattern including process patterns and a mask pattern composed of repetition of the chip patterns, and optimal alignment of the mask pattern to the wafer pattern. Although the resultant layout pattern obtained by this method is the same as shown in FIG. 4, the present embodiment differs in setting the chip coordinates in the step of layout pattern design from the conventional technology. It is described more specifically how to set the chip coordinates by referring to FIG. 4 as follows:

First, disposing a wafer pattern 3 such that an orientation flat (or OF) 7 is in the lower side on a page space, and, within the effective chips (shaded in the figure), choosing the chip 4 located in the most left column and the uppermost row, the chip 5 located in the most right column and the lowest row and the chip 6 located in the center of wafer or being adjacent to the center as the standard chip, the sub-standard chip and the center chip, respectively, the chip identification number is given to all the effective chips within the mask pattern 2. Next, a cross-point of the center lines of two scribe lines, one being on the left side of a chip and the other on the lower side of the chip, is chosen as the base point of the chip. Thus, the base point of the respective chip can be represented by relative coordinates having the base point of the center chip 6 as the origin. Furthermore, the relative coordinates based on the base point of the chip can represent any specific point within a chip. In other words, an arbitrary position of every chips that can be identified by the chip identification number can be represented by the sum of the relative coordinate having the base point of the center chip 6 as the origin and the relative coordinate having the base point of that chip as the origin.

Thus, the wafer map is generated by referring the lot numbers, wafer numbers and chip numbers to the chip coordinate as described above. The generated wafer map is then added to the layout data to send all of the subsequent fabrication processing steps as an electronic file through the data transfer path "a" shown in FIG. 3.

In the mask fabrication processing step 211, as in the conventional method, the layout pattern data is converted into the writing data capable of being inputted to an electron beam writing apparatus, whereby a plurality of glass masks corresponding to a plurality of layers needed to fabricate a semiconductor IC are fabricated. After visual inspection of the fabricated glass masks, the inspection data is added to the wafer map sent from the pattern layout design, and then is sent out to the next processing steps through a data transfer path "b" shown in FIG. 3.

When each of the fabrication processing steps subsequent to the mask fabrication processing step 211 receives the layout data, the corresponding step carries out the preparing operation needed to start the respective fabrication processing step immediately after the wafer is sent thereto. For instance, in the wafer fabrication processing step 212, the initial conditions for a stepper in the exposure processing step such as the starting position, moving direction and moving distance are set by using the wafer map, and operating conditions of the respective processing apparatus is also set by a lot number or a name of a semiconductor fabrication system added to the layout pattern data which is sent thereto. In the wafer testing step 213, the initial conditions of a prober such as the starting position, moving direction and moving distance are set such that only the effective chips arranged from the standard chip to the sub-standard chip are tested. Similar setting is also made for the initial conditions of a dicing apparatus in the wafer breaking processing step 214. Furthermore, the initial conditions of any processing apparatus for the fabrication processing steps subsequent to the mask fabrication processing step 211 can be amended, if necessary, by referring to the wafer map sent thereto through the data transfer path "b" from the mask fabrication processing step 211.

Next, in the wafer fabrication processing step 212, several fabrication processes are carried out on a wafer by using glass masks fabricated in the mask fabrication processing step 211 under the foregoing setting conditions. For instance, after a conductive or an insulating layer is formed on the wafer by using CVD or sputtering apparatus, a photoresist film is coated thereon by using spinner. Then, exposure is carried out over the photoresist film by stepper with a glass mask. As described before, since the stepper is already set for operation in advance, exposure can start being carried out immediately after the wafer is transferred thereto. The wafer having delineated photoresist film thereon is subsequently patterned by dry etching apparatus. The wafer fabrication processing step is repeated by the number of the glass masks. Although the foregoing processing steps are described for the case that a full wafer aligner is used for patterning, a stepping projection aligner is used for the case that finer patterns are desired to form, in which after converting the layout pattern data into the writing data capable of inputting to the electron beam writing apparatus, each of small divided areas of a wafer such as a single chip or several chips neighboring to each other is repeatedly exposed step by step, without using a glass mask or a reticle, by electron beam direct writing method. In the wafer fabrication processing step 212, an inspection for defects caused by dusts on the wafer surface is frequently carried out, and the inspection result is recorded on the wafer map, which is sent out to the subsequent processing steps through the path "c" as shown in FIG. 3. In the subsequent processing steps, referring to the electronic file sent from the glass mask processing step, the preliminary operation made in advance may be amended if any discrepancy is found therebetween. For instance, if any defect chips are newly found out after the wafer fabrication processing step, the initial conditions for the corresponding processing apparatus may be amended on the basis of the defect information. The wafer which the wafer fabrication processing step is finished with is sent to the wafer testing step. In the wafer testing step 213 shown in FIG. 3, since the initial conditions for the prober has been already set by the preparing operation determined on the basis of the wafer map which is sent through the data path "a", and the necessary amendment for the initial conditions for the prober has been finished on the basis of the wafer map which is sent through the data path "b" and "c", the wafer testing step can start immediately as soon as the wafer comes therein. For instance, since some of the effective chips on the wafer map sent in through the data path "a" are determined to be "defect chips" on the basis of the wafer map which is sent through the data path "b" and "c", these defect chips are excluded from the object to be tested. After the chip characteristics are measured by the prober for the finally determined effective chips, the measured result is newly recorded on the wafer map. The newly recorded wafer map and the measured wafer are sent out to the next step. Same as in the wafer testing step 213, in the wafer breaking step 214, assembly step 215 and IC testing step 216 subsequent to the wafer testing step 213, when the wafer is sent from the neighboring step ahead, the processing step also can start immediately by using the corresponding apparatus already initialized. In other words, in the wafer breaking step 214, not only the initialized dicing apparatus cuts the wafer into separate chips but also only the good chips are selected by removing the defect chips therefrom on the basis of the information recorded on the wafer map, and then sent out to the next assembly step. In the assembly step 215, not only the initialized wire bonding apparatus mounts the selected good chips on the package but also defect packages are removed by visual inspection. In the package testing step 216, screening test on the IC packages carried out to screen fail IC packages and further divide the passed IC packages into several groups with respect to characteristics. Finally, the IC packages are sent out to shipping step 219.

As shown in FIG. 3, when data are sent from the respective processing steps to the data superposing analysis member 217 in which causes for increase in the failure rate are analyzed, data formats of the respective processing steps are, in advance, converted to the format of the data sent from the layout pattern designing step such that the data obtained in the respective processing steps can be sent to the data superposing analysis member 217 promptly without converting each of the data formats. As described before, the chip identification information read from the wafer map is processed by comparing with the chip identification code written on the wafer. When full wafer exposure with glass masks is used to form the layout pattern, the specific glass mask only for the chip identification code is provided to form the chip identification code on the wafer by the same method as for the layout pattern. When a repetitive exposures of a small area on the wafer by a leticle or electron beam direct writing is used to form the layout pattern, forming of the chip identification code on the wafer by the same method as that for the layout pattern incurs higher cost. In the present invention, the chip identification code is edited by the following method, and the data for the electron beam direct writing is formed to write the chip identification code on the wafer.

Embodiment 3

Figure 5:
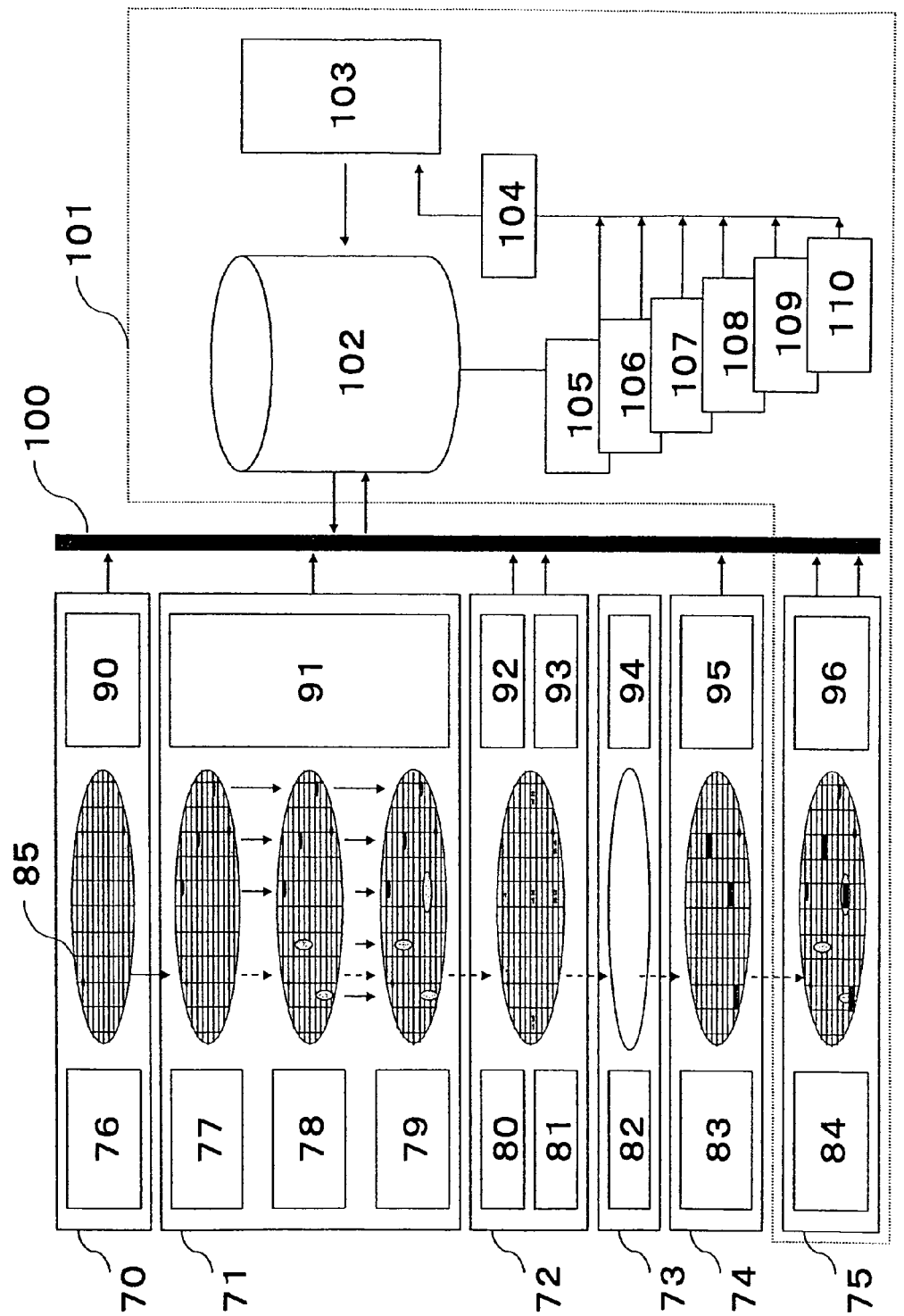
FIG. 5 is an illustration for data superposing analysis for the third embodiment according to the present invention.

FIG. 5 is an illustration for data superposing analysis for the third embodiment according to the present invention.

In FIG. 5, the various data referred to 90 through 96 of measurements, testing or analysis in the respective processing steps referred to blocks 70 through 75 in the left hand side are temporarily stored to the database 102 over the interface in the center 100, wherefrom, for instance, the manufacturing history data 105, the wafer inspecting data 106, the respective processing data 107, the analyzing data 108, the wafer patterning data 109 or the other data 110 are retrieved and collected by the data retrieving/collecting member 104 on demand. These data are remade to be useful information by a personal computer, for instance, and again stored to the database 102 through the data-mining member 103. Then, the information is fed back to the various measurements, testing and analysis blocks over the interface member 100. The blocks 100 and 101 shown in FIG. 5 correspond to the data superposing analysis member 217 shown in FIG. 3. Taking a closer look at it, in the block 70 for the layout pattern delineating step shown in the left hand side, the layout pattern 76 is delineated on the wafer 85, and the data 90 for delineating the layout pattern of the corresponding chip on the wafer are coded on the basis of the base point on the wafer 85 are output. In the block 71 including various processing steps, the wafer inspection data 91 on various kinds of foreign materials or defects on the wafer labeled by 77, 78, 79 are output in the in-line form. In the block 72 including various testing steps, the engineering monitor data 92 and electronic characteristics data 93 which correspond to WP (wafer processing measurements) 80 and WET (wafer electronic testing) 81, respectively are output. In the block 73 for the other processing steps, the data 94 corresponding to the other measurement 82 on demand are output. In the block 74 for the SORT processing step, after the sorting member 83 sorts the results of the above testing and measurements, only the fail data 95 which are fatal to the chip are output. Corresponding to the other measurement 82 on demands is output. In the block 75 for the mapping step, after a plurality of the mapping data are superposingly mapped on a single map 84, the analyzed data 96 such as Killer defect are output. These output data are sent to store in the database 102 over the interface 100.

Embodiment 4

Figure 6:
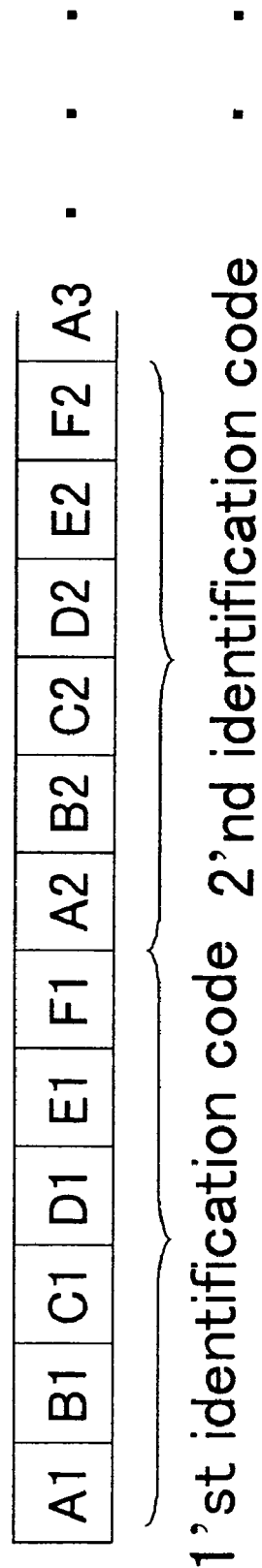
FIG. 6 is an illustration of the chip identification code and the editing method thereof for the fourth embodiment according to the present invention.

FIG. 6 is an illustration of the chip identification code and the editing method thereof for the fourth embodiment according to the present invention.

Figure 7:
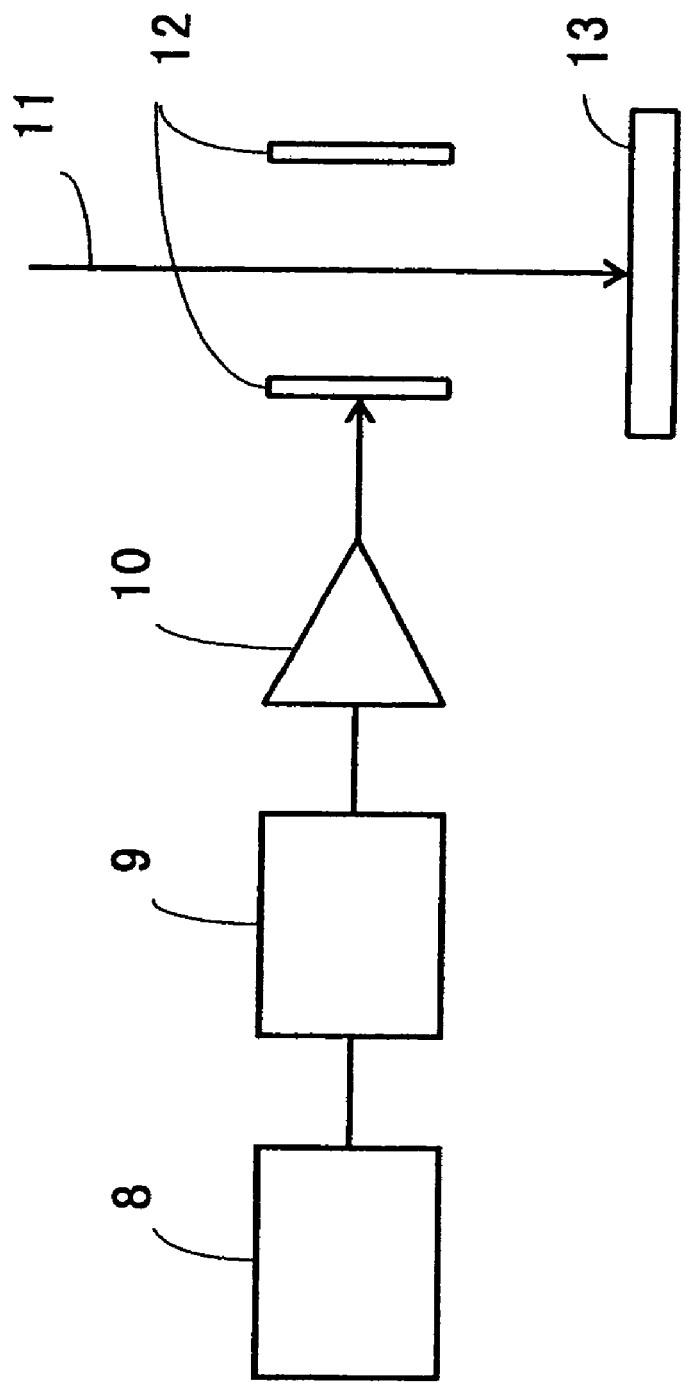
FIG. 7 is an illustration of direct writing of the identification code by electron-beam apparatus according to the present invention.

In FIG. 6, the first and second chip identification codes include lot numbers A1, A2, (A3 is a lot number for the third chip identification code), wafer numbers B1, B2, chip numbers C1, C2, relative addresses (or chip coordinates) of the first and second chips on the wafer D1, D2, and positions (or code coordinates) in which the first and second chip identification codes are formed on the wafer E1, E2, respectively. The relative address of the chip on the wafer D is represented by a position coordinate (d1, d2) in which d1 and d2 are numerical values representing the relative distances in the horizontal and vertical direction from the standard chip to the corresponding chip, respectively. The position in which the chip identification code is formed on the wafer E is usually the same value for all chips. In editing the chip identification code, at the first time, a group of the chip identification codes are formed in which the chips have the same lot and wafer numbers but the chip number changes sequentially on the same wafer. The arrangement of the chip identification code within a group is made such that, for instance, if the effective chips on the wafer are arranged as shown in FIG. 4, the first digit of the chip identification code is filled with the code for the chip located in the most left column of the uppermost, and then the subsequent digits are sequentially filled with the codes of the chips located from the second most left column to the most right column of the same uppermost row. After reaching the chip located in the most right column of the uppermost row, the following digit is filled with the code for the chip located in the most right column of the second upper row, and then the subsequent digits are sequentially filled with the codes of the chips located from the second most right column to the most left column of the same second upper row. Similarly, filling empty digits with the chip codes is sequentially continued to the last chip located in the most right column of the lowest row. Groups of the chip identification codes are formed for the corresponding groups of chips being different in the lot number or the wafer number from each other. The groups of the chip identification codes are further edited such that the groups having the same lot number are placed successively. The chip identification code described above are input for the direct writing data to the electron beam writing apparatus as shown in FIG. 7. The direct writing data are input the pattern generator 8, and after being converted into the digital signals for determining the writing position of the electron beam 11 on the wafer 13, the digital signals are again converted into the analog signals by the D/A converter 9. Subsequently, the deflection angle of the electron beam 11 is controlled by voltages applied to the pairs of the deflection electrodes 12 over the voltage amplifier 10 to write the pattern of the chip identification code on the wafer 13. If the specific chip identification code is defined for the foregoing writing data by giving the lot number and the wafer number, the chip identification code belonging to the group can be read in the sequence of the foregoing edition. Specifying the first digit of the chip identification code, the starting point of electron beam writing is set on the chip located in the most left column of the uppermost row, the chip identification code is written in the position represented by E. When the chip identification code read successively is written on the chip, the electron beam is successively shifted to the neighboring chip specified by the relative address D without resetting of the starting point of the electron beam writing on the chip to write the next code. Similarly, the chip identification codes are written successively on all of the remaining chips on the same wafer. In the foregoing writing method, since the deflection angle of the electron beam is varied largely from one edge to another edge over the wafer, accuracy of patterns decreases. However, since the high accuracy of patterns is not required to write the chip identification code, the decrease in accuracy of patterns cannot be any technical trouble. On the contrary, that makes it unnecessary to resetting of the starting position for the electron beam writing on every small writing region every time. If the pattern data of the chip identification code edited for every small writing region would be written on every small writing region independently from each other by the same method as that for the layout patterning using the electron beam writing, it would take much time to write the chip identification code on many chips due to resetting of the starting position for the electron beam writing on every small writing region every time. Therefore, the writing method described in the above embodiment is capable of decreasing the writing time largely, by which all of the chips on the same wafer can be written uninterruptedly.

Embodiment 5

Figure 8:
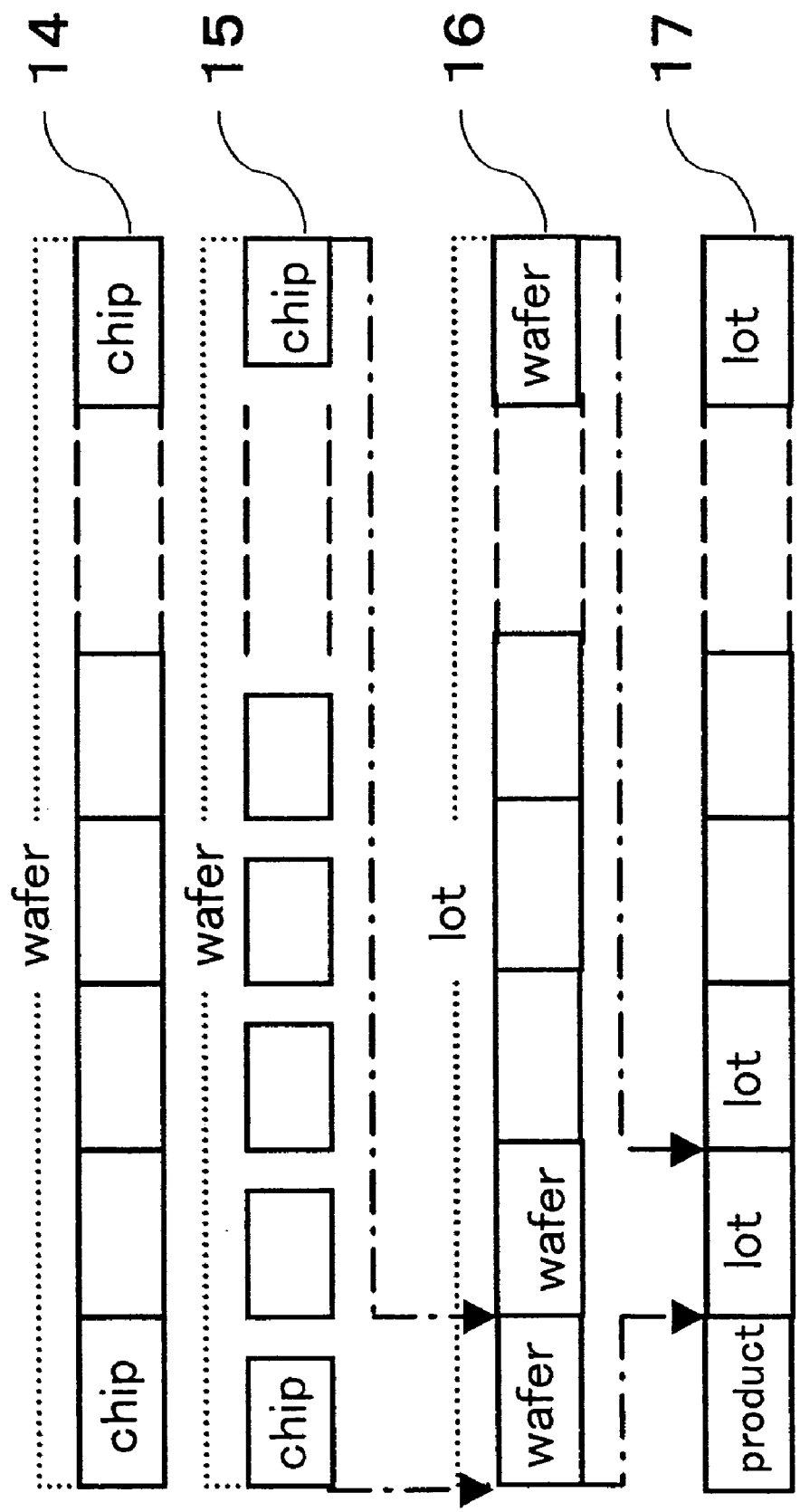
FIG. 8 is an illustration of a method for forming history information for the fifth embodiment according to the present invention.

FIG. 8 is an illustration of a method for forming history information for the fifth embodiment according to the present invention.

Using the FIG. 8, the following more specific explanation will be made on the method for forming history information for both prior art and the embodiment according to the present invention. As mentioned earlier, since the conventional method needs every time to form data exclusively designed for the mask pattern or the electron beam writing to delineate history information on the surface of every chip during the wafer fabrication processes, it is unrealistic with respect to cost and complexity of operation. For this reason, as a practical matter, the conventional chip identification code specifies only the lot number and the running number, and is delineated together with the layout pattern by full wafer exposure using a glass mask. Since the history information generated during the wafer fabrication processes is recorded on the corresponding wafer map by specifying the wafer as shown by the reference number 14 in FIG. 8, the chips are identified by specifying the wafer. In contrast, the data structure in the present invention, as shown by the reference number 15 in FIG. 8, not only the lot number but also the history information generated during the wafer fabrication processes are written on an individual chip and space between chips by the laser beam or electron beam. The product information, the wafer numbers, the respective chip information and the others are formed on each of the all chips in the same lot number by the writing process as shown by the reference numbers 16, 17 in FIG. 8. Consequently, since the writing process in the present invention can be carried out wafer by wafer or lot by lot in addition to chip by chip as in the conventional method, the full wafer writing process or the chip selective process in which chips can be specified is facilitated to the chips on the wafer or the area between chip areas. This makes it possible that it takes much shorter in the processing time to form the history information on the semiconductor device or mark thereon.

Although the foregoing explanation is on the cases that the chip identification code is written on all of the chips on the same wafer, it is also possible to read collectively all of the identification codes on the chips belonging to the same lot by only specifying the lot number it is also possible to read and then write collectively all of the identification codes on the chips in an arbitrary region on the same wafer by only specifying the particular group of the identification codes and any two of the identification codes belonging to the particular group. This makes it shorter in writing time to form the identification code on the specific area of every wafer, as well as lot by lot or wafer by wafer than before. Thus, the foregoing front end process is completed by sending the wafer having the code written thereon to the next process. When the testing is carried out with this wafer in the testing process, the testing result can be easily added to the chip identification code written on the wafer. As shown in FIG. 6, the chip identification code has the item of F for the testing result. If the testing result can be divided into 5 grades, and the obtained testing result corresponds to, for instance, the third grade, the added part of the chip identification code on the wafer will be represented by "F03". The additional chip identification code can be written on the wafer on which the wafer testing is completed by the foregoing method. Alternately, the chip identification code including the added part of the code can be written on each of the chips by laser beam after the chips are separated from the wafer. Furthermore, after a chip is packaged in the assembly process, the chip sealed in the package can be easily identified by the chip identification code written on the external surface of the package. The laser beam direct writing enables delineation of the chip identification code on the front or back surface of the chips disposed on the wafer, a lead frame or the surface of a chip mounted circuit board. Since the writing data is edited so as to process the chips either collectively in one wafer or selectively by specifying the particular chip, delineation of the chip identification code on the front or back surface of the chips can be carried out by processing the chips in one lot or one wafer successively, by which the writing time can be decreased.

According to the present invention, since the various information on the chip is added to the layout pattern in advance, which can be sent to all of subsequent processing steps in the form of the electronic file, this enables that the preliminary operation such as the best selection of the apparatus or the initial setting of the operational conditions before the respective processing step can start actually, and that the information on the respective chip can be shared by all of the processing steps. Additionally, since the chip identification code, which is the coded chip information, can be written on all of the chips in the wafer successively, it can take much shorter time to form the chip identification code than before, which results in that quality control and productivity control can be performed effectively and economically.

What is claimed is:

1. The method for manufacturing a semiconductor device by a plurality of fabrication processing steps, each of chips on a wafer being controlled based on a chip identification information formed on a wafer, the method comprising the steps of:
   editing the chip identification information such that the chip identification information for chips having the same fabrication processing steps and chips formed on the same wafer can be read out successively; and
   carrying out a first step of the fabrication processing steps based on the chip identification information formed on the wafer by reading out the chip identification information,
   wherein the chip identification information is distributed to a second step subsequent in the fabrication processing steps in advance to sending the wafer to the second step, said second step being not a step immediately next to the first step.

2. The method according to claim 1, further comprising the steps of:
   forming the chip identification information on the wafer; and
   adding additional information to the chip identification information by forming the additional information on the wafer, wherein the additional information is resulted from performance of the plurality of the fabrication processing steps.

3. The method according to claim 1, wherein the chip identification information on the wafer is coded.

4. The method for manufacturing a semiconductor device through a plurality of fabrication processing steps, each of the plurality of fabrication processing steps being carried out sequentially based on a chip identification information formed on a wafer, the method comprising a step of:
   sending additional processing information resulted from performance of a first step of the plurality of fabrication processing steps to a second step of the fabrication processing steps in advance to sending the wafer to the second step, wherein the first and second steps sharing the additional processing information with each other are non-consecutive steps,
   wherein the chip identification information includes a lot number, a wafer number, a chip coordinates and chip property, the chip coordinates indicating a geographical position on the wafer.

5. The method for manufacturing a semiconductor device through a plurality of fabrication processing steps, each of the fabrication processing steps being carried out sequentially with a plurality of chips on a wafer by the corresponding fabrication processing apparatus, the method comprising the step of:
   having at least two fabrication processing steps share a chip identification information formed on the wafer by distributing the chip identification information to the corresponding fabrication processing apparatus in advance to sending the wafer to a latter of the two fabrication processing steps,
   wherein said steps are non-consecutive steps in fabrication processing sequence, and
   wherein the plurality of the fabrication processing steps include at least one of layout pattern design, mask fabrication, wafer process, wafer testing, wafer breaking, assembly and IC testing.

6. The method for manufacturing a semiconductor device through a plurality of fabrication processing steps, each of the fabrication processing steps being carried out sequentially with a plurality of chips on a wafer by the corresponding fabrication processing apparatus, the method comprising the step of:

having at least two steps share a chip identification information formed on the wafer by distributing the chip identification information to the corresponding fabrication processing apparatus in advance to sending the wafer to a latter of the at least two steps, wherein said steps are non-consecutive steps in fabrication processing sequence, and wherein the chip identification information is formed on at least one of a chip, an area between chips, a package mounting a chip therein and a partial member of the package.

7. A system for manufacturing a semiconductor device through a plurality of fabrication processing steps, each of the fabrication processing steps being carried out sequentially with a plurality of chips on a wafer, the system comprising:

a plurality of fabrication processing apparatus corresponding to the plurality of fabrication processing steps; and information flow paths connecting a plurality of the fabrication processing apparatus with each other through an interface such that electronic data on an initial setting condition for each of the fabrication processing apparatus and history of processing and testing obtained by one of the plurality of fabrication processing apparatus is sent to at least another non-sequential fabrication processing apparatus in advance to sending the wafer to said another of the fabrication processing.

* * * * *